United States Patent
Abesingha et al.

(10) Patent No.: US 11,979,154 B1
(45) Date of Patent: May 7, 2024

(54) LOW POWER LEVEL SHIFTER

(71) Applicant: pSemi Corporation, San Diego, CA (US)

(72) Inventors: Buddhika Abesingha, San Diego, CA (US); Keith J. Rampmeier, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 18/056,229

(22) Filed: Nov. 16, 2022

(51) Int. Cl.
*H03K 19/0175* (2006.01)
*H03K 3/012* (2006.01)
*H03K 3/356* (2006.01)
*H03K 19/0185* (2006.01)

(52) U.S. Cl.
CPC ....... *H03K 3/012* (2013.01); *H03K 3/356113* (2013.01); *H03K 19/0175* (2013.01); *H03K 19/018521* (2013.01)

(58) Field of Classification Search
CPC ............. H03K 3/012; H03K 3/356113; H03K 19/0175; H03K 19/107509; H03K 19/0185; H03K 19/018507; H03K 19/018521; H03K 19/01; H03K 19/017; H03K 19/01721; H03K 19/003; H03K 19/00315; H03K 19/00369; H03K 19/00384
See application file for complete search history.

(56) References Cited

U.S. PATENT DOCUMENTS

| | | | |
|---|---|---|---|
| 6,734,704 B1 * | 5/2004 | Burkland | H03K 19/018571 326/63 |
| 7,679,420 B1 * | 3/2010 | Burkland | H03K 19/00361 327/333 |
| 2008/0122486 A1 | 5/2008 | Heath | |
| 2016/0277012 A1 | 9/2016 | Abesingha et al. | |
| 2021/0409010 A1 | 12/2021 | Javvaji et al. | |

FOREIGN PATENT DOCUMENTS

| | | |
|---|---|---|
| EP | 3570441 A1 | 11/2019 |
| KR | 20180103199 A | 9/2018 |

OTHER PUBLICATIONS

International Search Report and Written Opinion for International Application No. PCT/US2023/076812 filed on Oct. 13, 2023 on behalf of Psemi Corporation Mail Date: Feb. 2, 2024 11 pages.

* cited by examiner

*Primary Examiner* — Long Nguyen

(74) *Attorney, Agent, or Firm* — Steinfl + Bruno LLP

(57) ABSTRACT

Methods and devices to decrease the power consumption of level shifters in the absence of input power supply are disclosed. The described devices include current mirrors that are inactive when the level shifter is in the HIGH or LOW steady state. The disclosed methods further include a delay element used to keep the power consumption low in the case of slow input power supply ramps.

19 Claims, 5 Drawing Sheets

LOW POWER LEVEL SHIFTER

TECHNICAL FIELD

The present disclosure is related to level shifters, more in particular to methods and devices used to lower the power consumption of level shifters in the absence of input power supply.

BACKGROUND

A level shifter, also called logic-level shifter or voltage level translator, is a circuit used to translate signals from one logic level or voltage domain to another, allowing compatibility between integrated circuits with different voltage requirements. Traditional logic translators are based on complementary logic and rely on the presence of the input power supply for proper operation.

In the absence of the input power supply, the traditional logic translator or level shifters can have indeterminate states and large leakage. This generally results in a higher power consumption which may be prohibitive in some applications.

There is a need for a level shifter that is functional in the absence of the input power supply and consumes negligible or lower power as imposed by requirements.

SUMMARY

The disclosed methods and devices address the above-mentioned issues. The disclosed circuits can also be used as a power supply detector to provide a reset signal into conventional logic translators so that their output is well defined when the input supply is disabled.

Power sensitive mobile applications where various methods such as "standby" modes or "supply disable" modes are used for conserving battery life can greatly benefit from the disclosed teachings. Circuits that need to stay active in these "standby" or "supply disable" modes (such as a logic translator that helps maintain overall system state) are expected to consume negligible power when implementing the disclosed methods.

According to a first aspect of the present disclosure, a level shifter is provided, comprising: a first terminal configured to receive a first supply voltage; a second terminal configured to receive a second supply voltage, the second supply voltage being different from the first supply voltage; an output terminal; a first current mirror, a second current mirror connected to the first current mirror; a capacitor coupling the first current mirror to the second terminal; an input transistor connected to the first terminal, and to the second current mirror at a third terminal of the level shifter; a latching transistor connecting the second terminal to the output terminal, and an inverter connecting the third terminal to the output terminal.

According to a second aspect of the present disclosure, a method of voltage level shifting is disclosed, comprising: providing a first supply voltage; providing a second supply voltage; providing a first and a second current mirror; providing an input transistor; coupling the first current mirror to the first supply voltage; coupling the first current mirror to the second current mirror; coupling the second supply voltage to an output terminal via the second current mirror; applying the first supply voltage to the input transistor; changing a state of the first supply voltage from a first state to a second state; activating the first and the second current mirror, thereby changing a voltage at the output terminal in correspondence with the second state and the second power supply, and deactivating the first and the second current mirror.

Further aspects of the disclosure are provided in the description, drawings and claims of the present application.

DESCRIPTION OF THE DRAWINGS

Like reference numbers and designations in the various drawings indicate like elements.

DETAILED DESCRIPTION

Throughout this document, the term "connecting two transistors back-to-back" refers to a source-terminal to source-terminal connection of two transistors, or a drain-terminal to drain-terminal connection of two transistors.

Figure 1A:
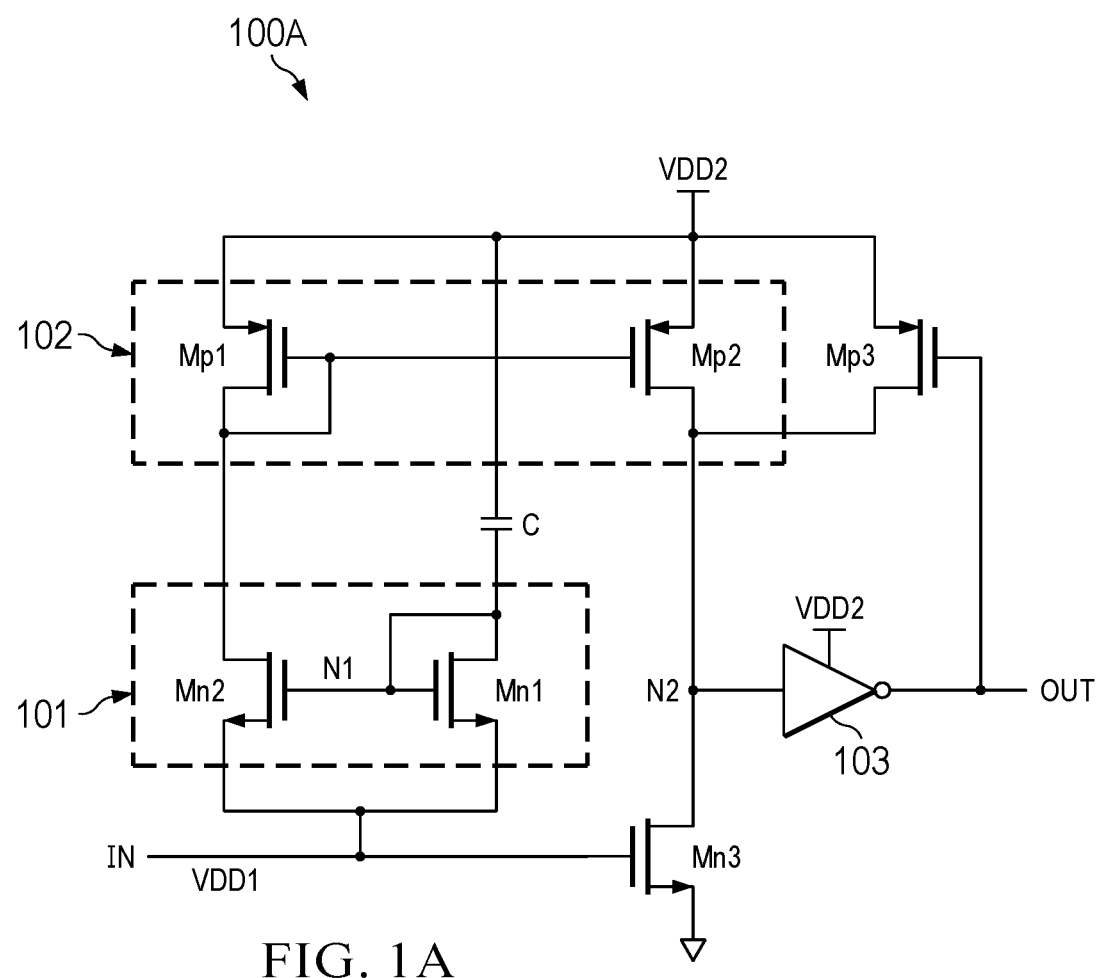
FIG. 1A shows an exemplary level shifter according to an embodiment of the present disclosure.

FIG. 1A shows an exemplary level shifter (100A) according to an embodiment of the present disclosure. Level shifter (100A) comprises a first current mirror (101) including transistors (Mn1, Mn2), a second current mirror (102) including transistors (Mp1, Mp2), latching transistor (Mp3), input transistor (Mn3), capacitor (C), and inverter (103). Also shown, are first supply voltage (VDD1) and second supply voltage (VDD2), representing essentially a first voltage domain and a second voltage domain of level shifter (100A), respectively. First supply voltage (VDD1) in applied to terminal (IN). Depending on the state of the circuit, first supply voltage (VDD1) may be in a HIGH or LOW state, the LOW state being ground (e.g., 0V) or a reference voltage other than ground. When the first supply voltage (VDD1 is in the LOW state, the voltage appearing at the terminal (OUT) is ground or equal to a reference voltage. On the other hand, when the first supply voltage (VDD1) is in a HIGH state, the voltage appearing at terminal (OUT) is equal to the second supply voltage (VDD2). Depending on the application, the value of the first voltage (VDD1) when in the HIGH state, may be greater or less than second voltage (VDD2). Exemplary values for first voltage (VDD1) when in the HIGH state, and second voltage (VDD2) may be 1.2V and 3.6V respectively.

With further reference to FIG. 1A, in accordance with the teachings of the present disclosure, when first supply voltage (VDD1) is in the HIGH state (active), the following describes the states of various elements of level shifter (100A):

transistor (Mn3) will be active (ON state) and as a result, the voltage at node (N2) will be pulled LOW, meaning that the voltage at terminal (OUT) is pulled HIGH (i.e. equal to the second supply voltage (VDD2).

Current mirrors (101, 102) and latching transistor (Mp3) are in the OFF state (inactive).

Due to leakage current through body diode (not shown) within transistor (Mn1), the voltage level of the gate terminals of transistors (Mn1, Mn2) will be at (VDD1).

A voltage equal to VDD2−VDD1 (i.e., the difference between the first and the second voltage) will appear across capacitor (C). This will help maintain the voltage at the gate terminals of transistors (Mn1, Mn2) at VDD1.

With continued reference to FIG. 1A, in accordance with the teachings of the present disclosure, when first voltage (VDD1) transitions from the HIGH to the LOW state, the following describes the states of various elements within level shifter (100A):

Transistor (Mn1) turns ON (active) due to the fact that the gate terminal of transistor (Mn1) is being held by capacitor (C) as mentioned above. This means that the gate-source voltage (Vgs1) of transistor (Mn1) is now greater than the gate-source threshold voltage (Vth) of such transistor.

Current starts flowing through transistor (Mn1) and capacitor (C), thereby pulling the voltage at terminal (N1) towards ground and charging capacitor (C) towards second voltage (VDD2).

Within current mirror (101), the current flowing through transistor (Mn1) is mirrored by transistor (Mn2), and then mirrored, within current mirror (102), by transistor (Mp1) into transistor (Mp2) to pull up the voltage appearing at terminal (N2) towards voltage (VDD2). This will force terminal (OUT) into the LOW state and transistor (Mp3) to turn ON (active) and keep/latch the voltage at terminal (N2) at the HIGH state.

The current through transistor (Mn1) will eventually reduce to near zero value once the gate-source voltage of transistor (Mn1) is less than the threshold voltage (Vth), i.e., Vgs1<Vth. Leakage current through Mn1 will continue to further reduce the Vgs1 of transistor towards zero, hence pulling the gate-terminal of transistor (Mn1) towards its source-terminal.

Based on the above, as a result of the current mirror (101) turning OFF (inactive), current mirror (102) will also turn OFF (inactive). In other words, the first voltage (VDD1) transition to the LOW state is complete and the circuit is in its steady state, with all transistors (Mn1, Mn2, Mp1, Mp2) being in an OFF state (inactive). Transistor (Mp3) remains in the HIGH state (active) to latch/maintain the voltage at terminal (N2) in the HIGH state and, as a result, the terminal (OUT) at the LOW state.

As previously mentioned, in general, in the absence of the input power supply (i.e. when the input power supply is in the LOW state), a traditional logic translator can have indeterminate states and large leakage. This generally results in a higher power consumption which may be prohibitive in some applications. On the other hand, in view of the above-disclosed teachings with regards to level shifter (100A), such problems are reduced or minimized by virtue of the fact that current mirrors (101, 102) are inactive when the input power supply is in the LOW state, reducing drastically any possible leakage, thereby decreasing the power consumption in this state. Moreover, terminal (OUT) is latched to the LOW state (determinate state) due to transistor (Mp3) being active and latching the voltage at terminal (N2) to voltage level (VDD2), i.e., the HIGH state.

Referring back to FIG. 1A, when the voltage (VDD1) is transitioning to the LOW state, the current mirror (101) will, as described above, will eventually transition to an OFF state as a result of parasitic current leakage through the transistor, such as through sub-threshold leakage of transistor (Mn1) or leakage through body diode (not shown) of transistor (Mn1). As a result, the time taken for such transitioning may be undesirably long and during this time, the current mirrors will pull current from voltage (VDD2) resulting in an unwanted increase in the power consumption.

Figure 1B:
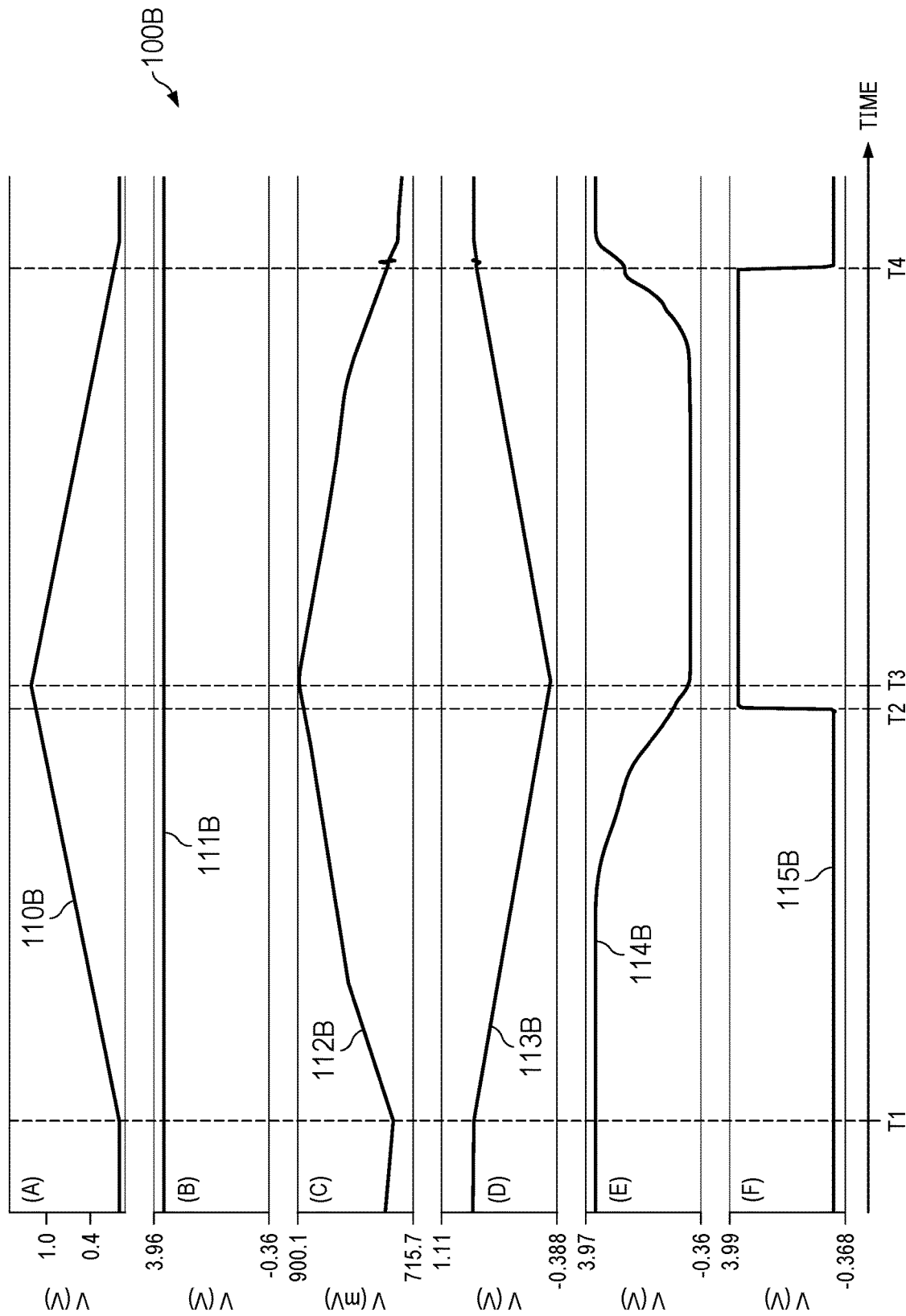
FIG. 1B shows an exemplary timing diagram according to the embodiment of FIG. 1A.

In order to further clarify this, reference is made to FIG. 1B showing an exemplary timing diagram (100B) according to an embodiment of the present disclosure, where diagrams (a) through (f) are being shown. Diagrams (a), (b), (d), (e) and (f) are in the volts (V) range, while diagram (c) is in the millivolts (mV) range. Simulations have been performed by the inventors, where voltage (VDD1) is ramped up and down periodically to analyze the voltage levels at various points of level shifter (100A) of FIG. 1A. The various diagrams (a)-(f) shown in FIG. 1B corresponds to a zoom-in of one period of the ramp. Curve (110B) of diagram (a) shows first voltage (VDD1) applied to terminal (IN) of FIG. 1A. In this specific example, first voltage (VDD1) is ramped up/down between 0 and 1.2V at a rate of 1.2V/100 ns. Curve (111B) of diagram (b) shows second voltage (VDD2) held at, for example, 3.6V. Curves (112B-115B) of respective diagrams (c)-(f) represent the voltage at the gate terminal of transistor (Mn1), the gate-source voltage of transistor (Mn1), the voltage at terminal (N2), and the voltage at terminal (OUT) of FIG. 1A, respectively.

With further references to FIGS. 1A-1B, it can be noticed that, due to relatively slow ramp rate, and the relatively slow transition of current mirror (101) to the inactive state as described above, when the voltage (VDD1) is starting to ramp up, the voltage level at the gate terminal of transistor (Mn1) is still higher than ground voltage by an amount of, for example, more than 700 mV. Moreover, during the voltage ramp-up, i.e. between time instants T1 and T3, the voltage at the gate terminal of transistor (Mn1), curve (112B) does not go through a substantial change (e.g., going from a little bit more than 700 mV to about 900 mV). On the other hand, as shown by curve (113B), the gate-source voltage of transistor (Mn1) decreases after the start of the ramp-up (i.e. time instant T1) and eventually reaches a point (time instant T2) when the voltage level at terminal (N2), as shown by curve (114B), is completely pulled down, forcing the voltage at terminal (OUT) to the HIGH state, as shown by curve (115B). At time instant (T3) voltage (VDD1) will start ramping down and the opposite of all the above-described effects will take place until the voltage at terminal (OUT) reaches the LOW state, after which the whole process will repeat at a rate given by the ramp-up/down period.

In what follows, another technique that can be used to overcome the undesired power consumption issue described above with regards to the embodiments of FIGS. 1A-1B, will be presented in detail. Such additional embodiment can be used in applications where the first supply voltage varies according to a slower up/down ramp.

Figure 1C:
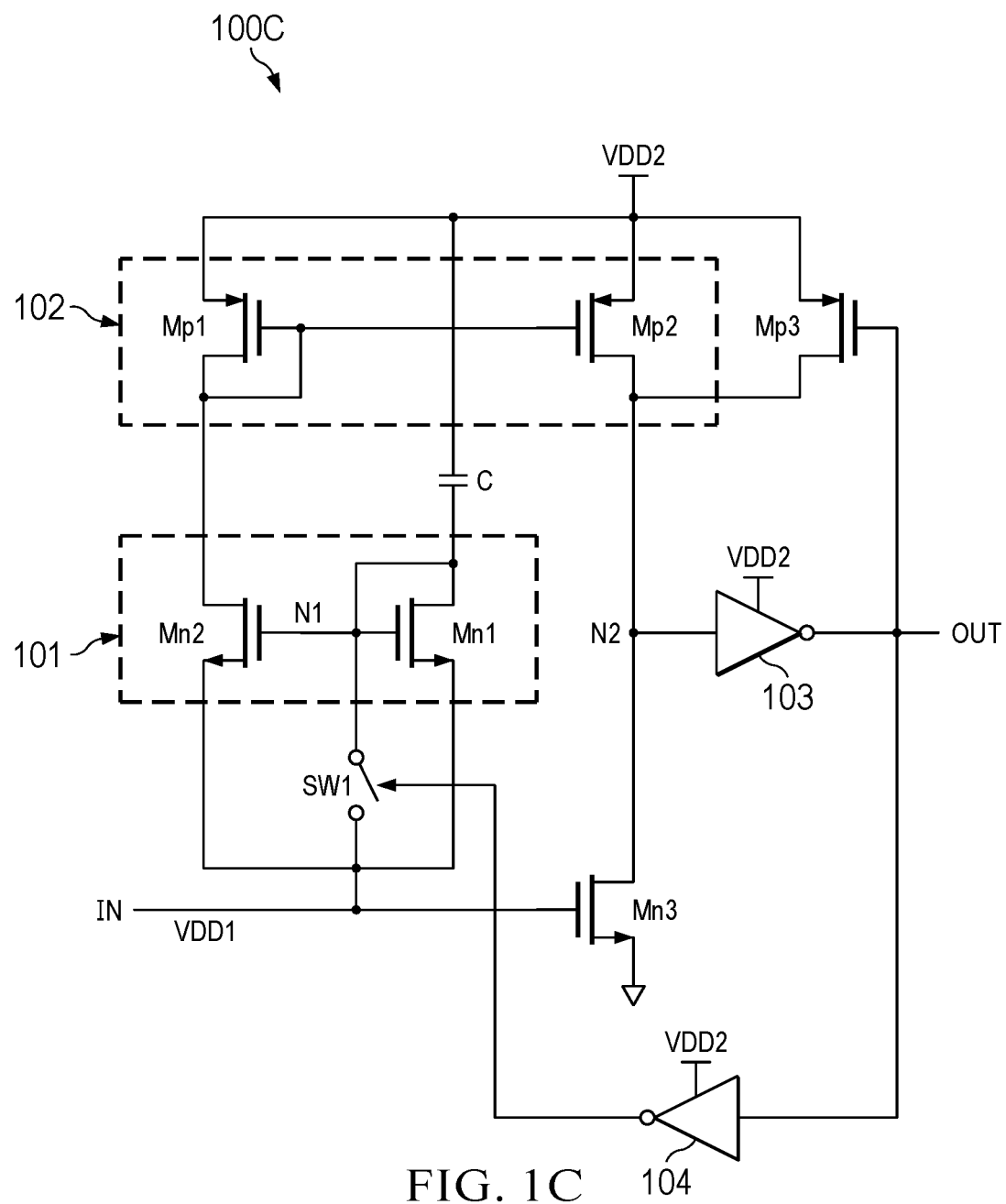
FIG. 1C shows an exemplary level shifter according to a further embodiment of the present disclosure.

In particular, FIG. 1C shows an exemplary level shifter (100C) according to such additional embodiment of the present disclosure. The principle of operation of level shifter (100C) is similar to what was described with regards to level shifter (100A) of FIG. 1A, except that level shifter (100C) further comprises a delay element (104) and switch (SW1), the delay element (104) coupling terminal (OUT) to switch (SW1) to control such switch through the voltage at terminal (OUT). When the voltage at terminal (OUT) reaches the HIGH state, delay element (104) produces an inverted output (LOW state) after a set time period (e.g., 2 ns). This means that switch (SW1) being already closed (active), remains closed (active) to force the gate terminal of transistor (Mn1) to voltage (VDD1) for a set time period (e.g. 2 ns) after terminal (OUT) reaches the HIGH state. After the delay/time period, the output from the delay element (104)

inverted (i.e. output transitions LOW) turning as a result switch (SW1) to an OFF state (open). This allows transistors (Mn1, Mn2) of current mirror (101) to turn on under very slow ramp rates when the first voltage (VDD1) transitions to a LOW state. In order to further clarify this, reference is made to FIG. 1D, showing an exemplary timing diagram (100D) according to the embodiment of FIG. 1C.

Diagrams (a)-(f) showing respective curves (110D-115D) are counterparts of corresponding curves (110B-115B) of FIG. 1B already described above. The additional curve (116D), shown in diagram (f), represents the voltage level at the output of delay element (104) of FIG. 1C where the HIGH state causes switch (SW1) of FIG. 1C to be closed and the LOW state causes switch (SW1) of FIG. 1C is open.

Figure 1D:
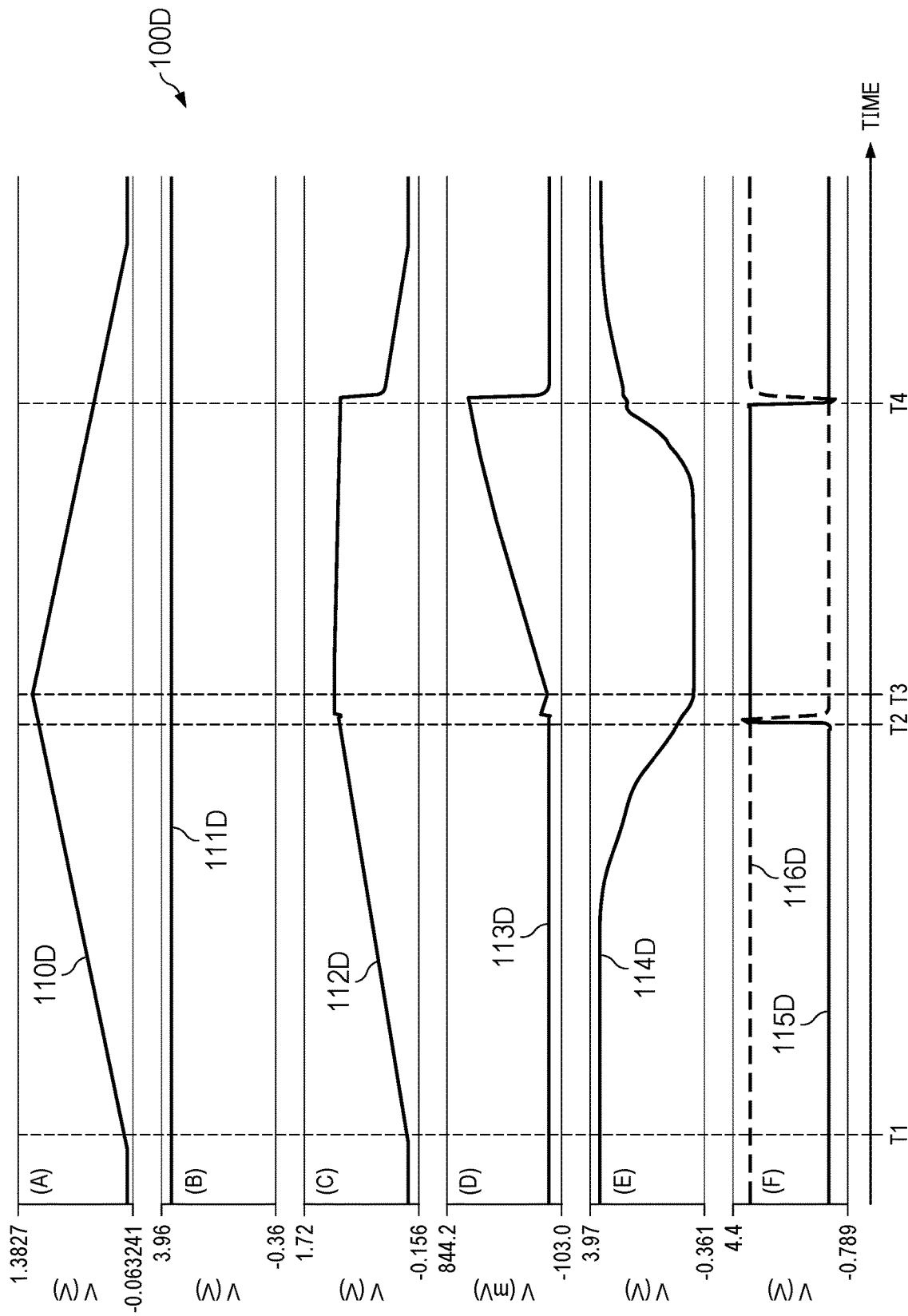
FIG. 1D shows an exemplary timing diagram according to the embodiment of FIG. 1C.

Upon comparison of timing diagrams (100B) of FIG. 1B and (100D) of FIG. 1D, it can be noticed that at time instant (T1), where first voltage (VDD1) starts ramping up, the gate-source voltage (Vgs1) of transistor (Mn1) of FIG. 1C is less than the threshold (Vth), meaning that transistor (Mn1) is completely in the OFF state (inactive), and this, differently from the case of the embodiment shown in FIG. 1A, results in an almost negligible power consumption for the embodiment of FIG. 1C when first voltage (VDD1) is in the LOW state. During the ramp-up, the switch (SW1), indicated by curve (116D), is in an ON state (closed) to short the gate terminal of transistor (Mn1) to first voltage (VDD1). As a result, the gate terminal of transistor (Mn1) will follow the ramp, as indicated by curve (112D). During this time, as indicated by curve (114D), the voltage at terminal (N2) is ramping down, until time instant (T3) when transistor (Mn3) is fully active, pulling the voltage at terminal (N2) completely down, thereby forcing the voltage at terminal (OUT) to go HIGH. After a set delay (e.g. 2 ns), the delay element (104) turns the switch (SW1) OFF (inactive). As a result, as indicated by curve (112D), the voltage level at the gate terminal of transistor (Mn1) remains constant as it is maintained at mostly the same level by capacitor (C). During the ramp-down, between time instants (T2, T3), as indicated by curve (113D), the gate-source voltage of transistor (Mn1) will ramp up and the current mirror (101) will start turning on causing a ramp-up on the voltage at terminal (N2), as indicated by curve (114D). At instant (T4), the voltage at terminal (OUT) will completely flip to the LOW state. After a set delay, the delay element (104) will turn switch (SW1) to short the gate terminal of transistor (Mn1) to first voltage (VDD1). As a result, the voltage at the gate terminal of transistor (Mn1) will follow the ramp-down, and the gate-source voltage (Vgs1) of transistor (Mn1) will drop to zero value, thus turning transistor (Mn1) completely OFF, so that there is no current flowing through current mirror. As a result, undesired power consumption will be avoided.

Figure 1E:
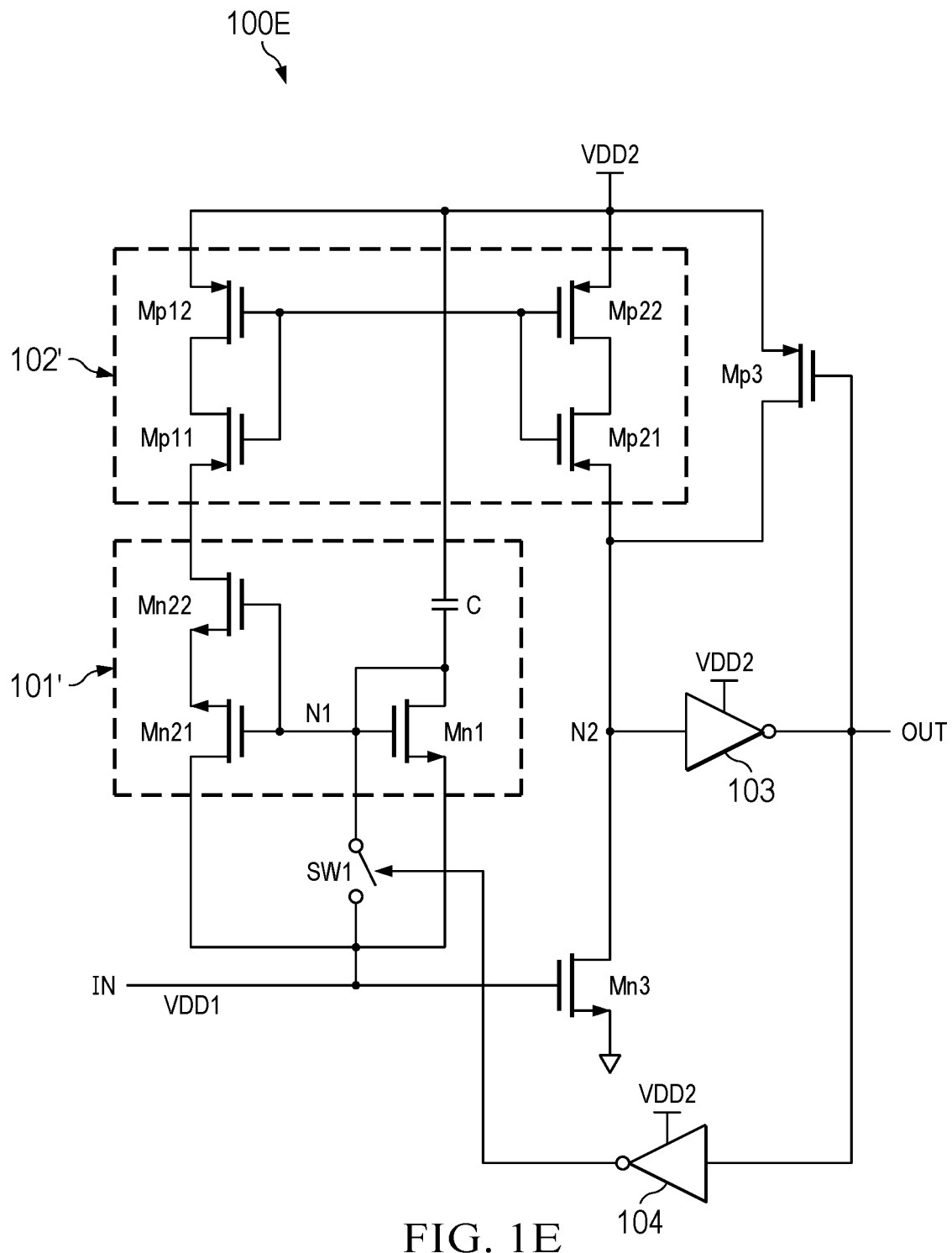
FIG. 1E shows an exemplary level shifter according to yet another embodiment of the present disclosure.

FIG. 1E shows an exemplary level shifter (100E) according to yet another embodiment of the present disclosure. The principle of operation of level shifter (100E) is similar to level shifter (100C) of FIG. 1C, except that transistor (Mn2) of FIG. 1C is replaced by two transistors (Mn21, Mn22) connected back-to-back, transistor (Mp1) of FIG. 1C is replaced by two transistors (Mp11, Mp12) connected back-to-back, and transistor (Mp2) of FIG. 1C is optionally replaced by two transistors (Mp21, Mp22) connected back-to-back. The benefit of implementing back-to-back connected transistors as shown in FIG. 1E is to allow for applications where VDD1 supply voltage is higher than VDD2 supply voltage. The back-to-back connected transistors prevent the parasitic body diodes of the transistors (Mn21, Mn22, Mp11, Mp12) from conducting current from VDD1 to VDD2, when VDD1 is higher than VDD2. Such current conduction from VDD1 to VDD2 will lead to significant power dissipation as well as malfunction of level shifter. The level shifter (100E) in FIG. 1E eliminates unwanted current conduction from VDD1 to VDD2, especially when VDD1 is greater than VDD2.

With reference to FIGS. 1A, 1C, 1E transistors (Mn1, Mn2, Mn21, Mn22) may include N-Channel Field Effect Transistors (NFETs) and transistors (Mp1, Mp2, Mp3, Mp11, Mp12, Mp21, Mp22) may include p-Channel Field Effect Transistors (PFETs).

The embodiments shown in FIGS. 1A, 1C, 1E, in addition to function as level shifters, may be used for power supply detectors. This would be accomplished by connecting the input terminal IN of level shifter(s) 100A, 100C, and 100E in FIGS. 1A, 1C, and 1E respectively to the input power supply VDD1. If the input power supply VDD1 is low or substantially close to zero, the input terminal will have a voltage at or near zero which will produce a LOW output state at terminal OUT. If the input power supply VDD1 produces a voltage greater than the threshold voltage of Mn3 (e.g. VDD1>0.7V), the output will have a HIGH state, thereby functioning as a power supply detector that consumes little to no power consumption.

The teachings of the present disclosure can be applied to any suitable electronics but will be most useful in low-power application or applications where the supply of power is limited or constrained (e.g. in a mobile battery-powered application).

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A level shifter comprising:
a first terminal configured to receive a first supply voltage;
a second terminal configured to receive a second supply voltage, the second supply voltage being different from the first supply voltage;
an output terminal;
a first current mirror,
a second current mirror connected to the first current mirror;
a capacitor coupling the first current mirror to the second terminal;
an input transistor connected to the first terminal, and to the second current mirror at a third terminal of the level shifter;
a latching transistor connecting the second terminal to the third terminal, and
an inverter connecting the third terminal to the output terminal.

2. The level shifter of claim 1, wherein:
in a LOW state of the first supply voltage:
the first current mirror and the second current mirror are configured to be inactive;
the input transistor is configured to be inactive; and
the latching transistor is configured to be active,
thereby forcing a voltage at the output terminal to be at ground or at a reference voltage other than ground.

3. The level shifter of claim 2, wherein:
in a HIGH state of the first supply voltage:
the first current mirror and the second current mirror are configured to be inactive;
the latching transistor is configured to be inactive; and
the input transistor is configured to be active,
thereby forcing a voltage equal to the second supply voltage at the output terminal.

4. The level shifter of claim 3, wherein in the HIGH state of the first supply voltage, the capacitor is charged with a voltage equal to the difference of the second supply voltage and a voltage of the first supply voltage at the HIGH state.

5. The level shifter of claim 3, wherein during a transition of the first supply voltage from the HIGH to the LOW state, the first current mirror and the second current mirror are configured to be active.

6. The level shifter of claim 1, wherein the first current mirror comprises a first current mirror first transistor and a first current mirror second transistor, wherein gate-terminals of the first current mirror first transistor and the first current mirror second transistor are tied together, the source-terminals of the first current mirror first transistor and the first current mirror second transistor are tied together, and the drain-terminal of the first current mirror first transistor is tied to the gate-terminal of the first current mirror first transistor, thereby connecting the capacitor to the gate-terminal of the first current mirror first transistor.

7. The level shifter of claim 6, wherein the second current mirror comprises a second current mirror first transistor and a second current mirror second transistor, wherein gate terminals of the second current mirror first transistor and the second current mirror second transistor are tied together, source terminals of the second current mirror first transistor and the second current mirror second transistor are tied together, and a drain terminal of the second current mirror first transistor is tied to a gate terminal of the second current mirror first transistor.

8. The level shifter of claim 6, further comprising a switch coupling the gate terminal of the first current mirror first transistor to the source terminal of the first current mirror first transistor.

9. The level shifter of claim 8, further comprising a delay element coupling the output terminal to the switch.

10. The level shifter of claim 9, wherein:
in a LOW state of the first supply voltage:
the delay element is configured to close the switch; and, in a HIGH state of the first supply voltage:
the delay element is configured to open the switch.

11. The level shifter of claim 10, wherein
during a transition from the LOW state to the HIGH state of the first supply voltage:
the delay element is configured to keep the switch closed for a set duration;
and, during a transmission from the HIGH state to the LOW state of the first supply voltage:

the delay element is configured to keep the switch open for the set duration.

12. The level shifter of claim 7, wherein the first current mirror first transistor comprises a first and a second transistor connected back-to-back.

13. The level shifter of claim 12, wherein the second current mirror first transistor comprises a third and a fourth transistor connected back-to-back.

14. The level shifter of claim 13, wherein the second current mirror second transistor comprises a fifth and a sixth transistor connected back-to-back.

15. The level shifter of claim 6, wherein the first current mirror first and second transistors include NFETs, and the second current mirror first and second transistors include PFETs.

16. The level shifter of claim 15, wherein the latching transistor includes a PFET.

17. The level shifter of claim 16, wherein the input transistor includes an NFET.

18. The level shifter of claim 7, wherein drain terminals of the first current mirror second transistor and the second current terminal first transistor are tied together.

19. A method of voltage level shifting comprising:

providing a first supply voltage;

providing a second supply voltage;

providing a first and a second current mirror;

providing an input transistor;

coupling the first current mirror to the first supply voltage;

coupling the first current mirror to the second current mirror;

coupling the second supply voltage to an output terminal via the second current mirror;

applying the first supply voltage to the input transistor;

changing a state of the first supply voltage from a first state to a second state;

activating the first and the second current mirror, thereby changing a voltage at the output terminal in correspondence with the second state and the second power supply, and deactivating the first and the second current mirror.

\* \* \* \* \*